United States Patent
Tanimoto

(10) Patent No.: US 7,772,058 B2
(45) Date of Patent: Aug. 10, 2010

(54) METHOD OF MANUFACTURING SILICON CARBIDE SEMICONDUCTOR DEVICE

(75) Inventor: Satoshi Tanimoto, Yokohama (JP)

(73) Assignee: Nissan Motor Co., Ltd., Yokohama-shi, Kanagawa (JP)

(*) Notice: Subject to any disclaimer, the term of this patent is extended or adjusted under 35 U.S.C. 154(b) by 60 days.

(21) Appl. No.: 12/022,607

(22) Filed: Jan. 30, 2008

(65) Prior Publication Data

US 2008/0227256 A1 Sep. 18, 2008

(30) Foreign Application Priority Data

Mar. 16, 2007 (JP) .............................. 2007-068572

(51) Int. Cl.
*H01L 21/336* (2006.01)
*H01L 21/8234* (2006.01)

(52) U.S. Cl. ............... 438/197; 257/288; 257/E27.099; 257/E29.13

(58) Field of Classification Search ................ 438/197, 438/931; 257/288, E27.099, E29.13
See application file for complete search history.

(56) References Cited

U.S. PATENT DOCUMENTS

| | | | |
|---|---|---|---|
| 6,482,704 B1 * | 11/2002 | Amano et al. ............... | 438/285 |
| 6,764,963 B2 * | 7/2004 | Fukuda et al. .............. | 438/778 |
| 7,535,025 B2 * | 5/2009 | Tanimoto et al. .............. | 257/77 |
| 2002/0047125 A1 | 4/2002 | Fukuda et al. | |
| 2003/0107041 A1 | 6/2003 | Tanimoto et al. | |

FOREIGN PATENT DOCUMENTS

| | | |
|---|---|---|
| JP | 10-313116 | 11/1998 |
| JP | 11-274487 | 10/1999 |
| JP | 2000-22137 A | 2/2000 |
| JP | 2002-151680 A | 5/2002 |
| JP | 2003-031571 A | 1/2003 |
| JP | 2003-243654 A | 8/2003 |
| JP | 2004-031864 | 1/2004 |
| JP | 2005-223003 A | 8/2005 |
| JP | 2006-074024 | 3/2006 |
| JP | 2006-080273 A | 3/2006 |
| WO | 2007/026622 A1 | 3/2007 |

* cited by examiner

*Primary Examiner*—Davienne Monbleau
*Assistant Examiner*—Monica D Harrison
(74) *Attorney, Agent, or Firm*—Young Basile

(57) ABSTRACT

A MOS type SiC semiconductor device having high reliability and a longer lifespan against TDDB of a gate oxide film is disclosed. The semiconductor device includes a MOS (metal-oxide-semiconductor) structure having a silicon carbide (SiC) substrate, a polycrystalline Si gate electrode, a gate oxide film interposed between the SiC substrate and the polycrystalline Si gate electrode and formed by thermally oxidizing a surface of the SiC substrate, and an ohmic contact electrically contacted with the SiC substrate. The semiconductor device further includes a polycrystalline Si thermally-oxidized film formed by oxidizing a surface of the polycrystalline Si gate electrode. The gate oxide film has a thickness of 20 nm or less, preferably 15 nm or less.

14 Claims, 12 Drawing Sheets

METHOD OF MANUFACTURING SILICON CARBIDE SEMICONDUCTOR DEVICE

CROSS-REFERENCE TO RELATED APPLICATIONS

This application claims priority from Japanese Patent Application Serial No. 2007-068572, filed Mar. 16, 2007, which is incorporated herein in its entirety by reference.

TECHNICAL FIELD

The present invention generally relates to a method of manufacturing a silicon carbide (SiC) semiconductor device, and more particularly to a method of manufacturing a gate oxide film of a SiC semiconductor device having a MOS (Metal-Oxide-Semiconductor) structure.

BACKGROUND

Silicon carbide devices exist that are capable of operating under high pressure and temperature with extremely low loss. This is due to the use of a large diameter wafer (presently 4H-SiC with a diameter of up to 4 inches), the use of which was previously problematic as a result of the low channel mobility of a MOS interface. Among the SiC devices, a SiC-MOS device (MOSFET or IGBT) can be easily driven and simply replaced by currently available Si-IGBTs. Thus, it is considered as one of the most preferred switching devices, which have the power region of several kV or less.

Silicon carbide semiconductor devices are the only wide gap semiconductor device capable of generating silicon oxide by thermal oxidation, which has been an influential basis for asserting the advantages of the silicon carbide semiconductor device.

BRIEF SUMMARY

In accordance with one aspect of the invention as embodied herein, a silicon carbide (SiC) semiconductor device with a metal-oxide-semiconductor (MOS) structure including a SiC substrate is formed. A gate oxide film is formed on a surface of the SiC substrate, and a gate electrode is formed on the gate oxide film. The method of manufacturing such a device comprises increasing a temperature to at least a predetermined temperature while maintaining the SiC substrate in an inert gas atmosphere, forming the gate oxide film by thermally-oxidizing the SiC substrate by introducing an oxidation gas when the temperature rises to at least the predetermined temperature and decreasing the temperature by stopping the thermal oxidation of the SiC substrate while stopping the introduction of the oxidation gas and reestablishing the inert gas atmosphere when a thickness of the gate oxide film becomes a predetermined thickness.

BRIEF DESCRIPTION OF THE DRAWINGS

The description herein makes reference to the accompanying drawings wherein like reference numerals refer to like parts throughout the several views, and wherein.

DETAILED DESCRIPTION OF EMBODIMENTS OF THE INVENTION

Figure 1:
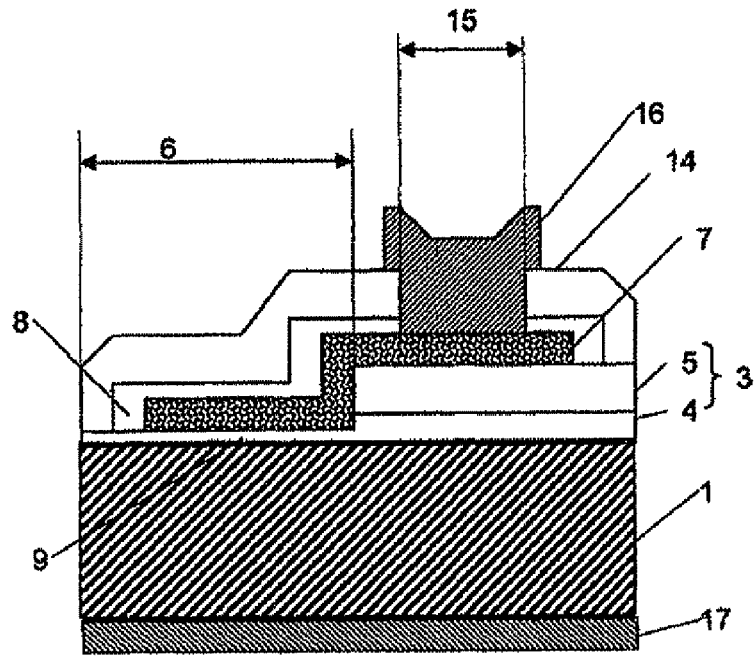
FIG. 1 is an enlarged sectional view of a part of a semiconductor device in accordance with a first embodiment of the invention.

Detailed descriptions are provided below for the embodiments disclosed herein with reference to the drawings. Hereinafter, silicon carbide is denoted as SiC, silicon oxide is denoted as $SiO_2$, Metal-Oxide-Semiconductor is denoted as MOS, time dependent dielectric breakdown is denoted as TDDB, and medium charge to breakdown is denoted as MCTB. A SiC substrate, on which an epitaxial layer, other layers and an electrode are formed, is referred to as a substrate unless otherwise specified.

In known silicon carbide semiconductor devices, a gate oxide film forms by thermal oxidation of silicon carbide and presents the following problems: (1) an extremely short life span against time dependent dielectric breakdown compared to a thermal oxide film of a silicon substrate; and (2) the high defect rate due to the large wafer area. These problems appear frequently in SiC substrates, particularly in 4H-SiC substrates (H=hexagonal) as shown in Table 1. Table 1 compares the MCTB and expansion of a TDDB life $Q_{BD}$ ($C/cm^2$) of a gate oxide film on a 4H-SiC substrate. The data is based on the following references: M. Treu et al., Materials Science Forum, Vols. 338-342 (2000), pg. 1089; Tanimoto, Arai Kazuo and Yoshida, Sadafumi, "Principle and Application of SiC Element" published by Ohmsha, 1st Ed., 2003), Section 3-2, Clause 4; K. Fujihira et al., IEEE Electron Device Letters, Vol. 25 (2004), pg. 735; Senzaki et al., Journal of Institute of Electronics, Information and Communication Engineers C, Vol. J89 C (2006), pg. 597. The data was derived from many tests on a MOS capacitor having a very small gate area with a diameter of approximately 200 μm and a gate oxide film having a thickness of 25 nm to 59 nm. $Q_{BD}$ represents a total charge quantity per unit area that passed through the gate oxide film until TDDB occurred when a current stress was applied to the gate oxide film. $Q_{BD}$ is widely used as an index for measuring reliability. $T_{ox}$ represents the time of oxidation.

TABLE 1

| Reference | MCTB (C/cm$^2$) | $Q_{BD}$ Distribution (Order) | $T_{ox}$ (nm) |
|---|---|---|---|
| 1 | 1 | 2.5 | 24 |
| 2 | 0.1 | 1.5 | 40 |
| 3 | 1 | 3 | 40 |
| 4 | 0.5 | 1 | 50 |

The resulting data shows that an MCTB of 1 C/cm$^2$ is preferred. However, this value is lower by at least one order of magnitude compared to the $Q_{BD}$ of a thermal oxide film, for example a thermal oxide film with a thickness of 40 nm formed on a Si substrate. Also, according to the results shown in Table 1, the better the MCTB is, the wider the life distribution will be. Even though the MCTB test results are good for a large capacity power MOS device or a large scale MOS integrated circuit (wherein a total gate area is large), the actual lifespan $Q_{BD}$ of the device is very short.

Factors determining the TDDB life of a SiC thermal oxide film based on the published data has been studied by the inventor. As reported by the inventor in Yamoto et al., The 51$^{st}$ Lecture of Applied Physics and Related Societies (Tokyo Institute of Technology), Lecture No. 29p-ZM-5, Lecture Script, p. 434 (2004), the TDDB life of a commercially-available SiC thermally-oxidized film is determined by the large amount of dislocation, in the order of 10$^4$ locations/cm$^2$, that exists on the surface of a SiC substrate, which is different from a Si thermally-oxidized film. However, the results reported in Table 1 are uneven. Thus, the inventor has concluded that prior art devices cannot reach the lifespan determined by such dislocation.

Accordingly, embodiments of the invention taught herein are designed to overcome reliability problems by providing a method of manufacturing a MOS type SiC semiconductor device having high reliability, thereby improving the lifespan against the TDDB of a gate oxide film.

In this discussion of the embodiments, it should be noted that the drawings are schematic, and that the relationship between a thickness and a planar dimension and a ratio of one layer to another in terms of thickness are not depicted to scale.

Figure 2:
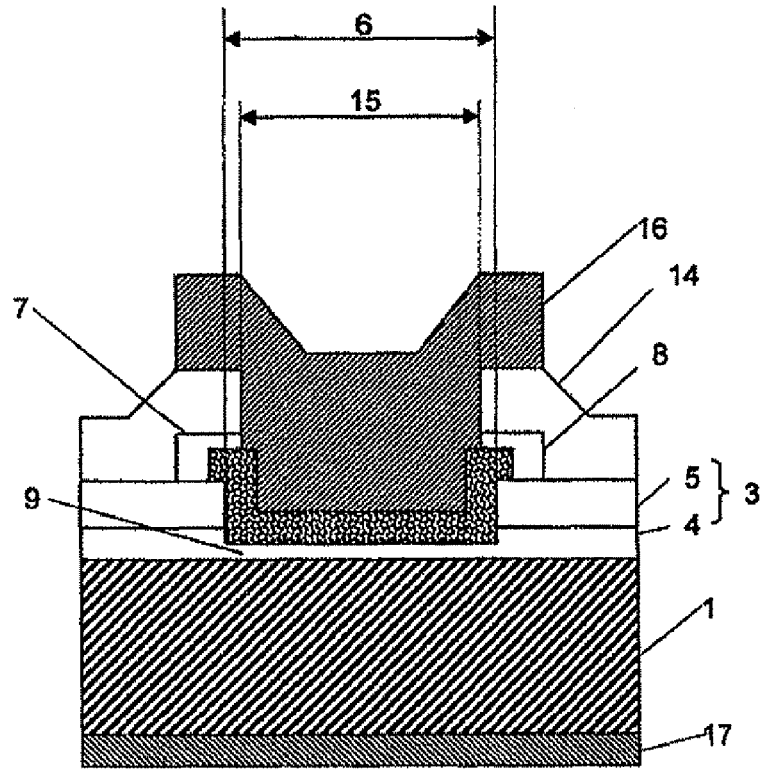
FIG. 2 is an enlarged sectional view of a part of another semiconductor device in accordance with the first embodiment.

In one embodiment, the method taught herein is applied to a MOS structure (capacitor), which is the simplest MOS device. FIGS. 1 and 2 are sectional views of a part of a MOS structure. However, it should be noted that the embodiments disclosed can be applied to any structure.

In FIGS. 1 and 2, an n$^+$ 4H-SiC epitaxial substrate 1 is obtained by growing an n$^-$ epitaxial layer homoepitaxially on an upper surface of a substrate. The substrate 1 has a high impurity concentration (such as nitrogen>1×10$^{+19}$/cm$^3$). A p$^+$ 4H-SiC epitaxial substrate, which is obtained by growing a p$^-$ epitaxial layer homoepitaxially on an upper surface of a substrate, and which also has a high impurity concentration (such as Al>1×10$^{+19}$/cm$^3$), can also be used. In lieu of the 4H-substrate, a 6H-substrate, a 3C-substrate or a 15R-substrate can be used (H represents a hexagonal system, C represents a cubic system and R represents a rhombohedral system). Embodiments are not limited by the conduction type of the epitaxial layer or substrate, the crystal system of the substrate or the surface direction of the substrate.

A field insulating film 3 with a thickness of more than hundreds of nanometers is formed on the SiC epitaxial substrate 1. The field insulating film 3 has a structure in which an upper insulating film 5 is laid on a lower insulating film 4. The lower insulating film 4 is thinner than the upper insulating film 5 and is formed by thermally oxidizing a SiC substrate (an epitaxial layer in its exact term). The upper insulating film 5 is formed by using a process other than the thermal oxidizing process, such as a low-pressure CVD process. A gate window 6 is opened in the field insulating film 3.

A gate electrode 7 made from polycrystalline Si is provided on the field insulating film 3 in such a way that the gate electrode 7 completely or partially covers a bottom of the gate window 6. The polycrystalline Si gate electrode 7 may have a conduction type of n-type or p-type. Also, the polycrystalline Si gate electrode 7 may be formed by silicidating the surface with Ti or Co. A polycrystalline Si thermally-oxidized film 8, which is grown by a thermal oxidation process, is formed at least on the side surface of the polycrystalline Si gate electrode 7.

A gate oxide film 9, formed by thermally oxidizing the surface of the SiC substrate 1, is interposed between the SiC epitaxial substrate 1 and the gate electrode 7 on the bottom of the gate window 6. To extend the lifespan against TDDB, the thickness of the gate oxide film 9 can be 20 nm or less, and preferably is 15 nm or less. In order to restrain a life distribution (extension) against TDDB, a thickness of 8 nm or more provides better results. However, the thinner gate oxide film can be used in a device in which a total area of the gate is small.

An interlayer insulating film 14 is formed on the gate electrode 7 and the field insulating film 3. A gate contact window 15 is opened in the interlayer insulating film 14 in such a way that the gate contact window 15 penetrates through the gate electrode 7. An interconnection 16 connects the gate electrode 7 with other circuit components on the same substrate or with external circuits through the gate contact window 15. The gate contact window 15 may be configured so as to be provided on the gate electrode 7 in the gate window as shown in FIG. 2, rather than being provided on the gate electrode 7 on the field insulating film 3 as shown in FIG. 1. However, if the MOS structure is used at a temperature of 150° C. or more, the structure shown in FIG. 1 is more appropriate because in the structure of FIG. 2, a problem may occur in which the gate oxide film is deteriorated by diffusion of an element of the material of the interconnection.

An ohmic contact 17 with a low resistance is arranged on a back surface (or an upper surface) of the SiC substrate 1. The ohmic contact 17 can be formed by first depositing a contact metal such as Ni on the back surface of the SiC substrate 1. Thereafter, the contact metal is alloyed with SiC by using a rapid thermal process at a temperature lower than the thermal oxidation temperature of the gate oxide film 9 (e.g., at 1,000° C. if the thermal oxidation temperature is 1,100° C.).

A method of manufacturing the MOS structure shown in FIG. 1 is next explained with reference to FIGS. 3 to 6.

Figure 3A:
FIGS. 3A-3C are sectional views of the semiconductor device of the first embodiment shown in stages of a process of manufacturing the device.

A high-quality n$^-$ epitaxial layer is grown on the upper surface of the substrate 1. As such, the n$^+$ 4H-SiC epitaxial substrate 1 with an 8° off-cut towards the (0001) Si longitudinal section is formed. Subsequently, the n$^+$ 4H-SiC epitaxial substrate 1 is fully cleaned by an RCA cleaning process or the like. The RCA cleaning process is a method of cleaning a semiconductor substrate comprising cleaning by using an $H_2O_2+NH_4OH$ mixed solution and cleaning by using an $H_2O_2+HCl$ mixed solution. Thereafter, the $n^+$ 4H-SiC epitaxial substrate 1 is oxidized with dry oxygen gas. As shown in FIG. 3A, the field insulating film 3, which includes the thin lower insulating film 4 and the thick upper insulating film 5, is formed on the upper surface of the substrate 1. A SiC thermally-oxidized film with a thickness of approximately 10 nm, which is formed by preparing the surface of the epitaxial substrate 1 by dry oxidation in an oxygen atmosphere, can be used for the lower insulating film 4. An insulating film with a desired thickness, which is formed by a process other than the thermal oxidation process, can be used for the upper insulating film 5. For example, a $SiO_2$ film with a thickness of 400 nm, which is formed by an atmospheric pressure CVD process using oxygen and silane, can be used for the upper insulating film 5. The thermal oxidation of the lower insulating film 4 is not limited to dry oxidation. That is, wet oxidation or thermal oxidation using another oxidizing gas may be used instead. In certain embodiments, the thickness of the lower insulating film 4 is smaller than 50 nm. A thickness in the range of 5 nm to 20 nm is desirable. The upper insulating film 5 may be formed after the lower insulating film 4 is grown on the surface of the epitaxial substrate 1, as described above. Alternatively, the lower insulating film 4 may be grown between the epitaxial layer 2 and the upper insulating film 5 by thermal oxidation after the upper insulating film 5 is formed. A first transitory thermally-oxidized film 201 naturally forms on the back surface of the substrate 1 when the lower insulating film 4 is formed. The first transitory thermally-oxidized film 201 effectively removes a considerably deep, grinding-induced damaged layer in the back surface of the substrate 1.

Figure 3B:
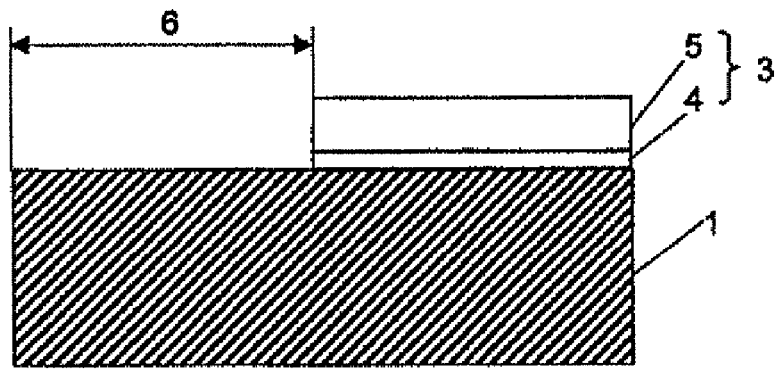

Next, the surface of the SiC substrate 1 is coated with photoresist, exposed to light and then developed. Thereafter, the SiC substrate 1 is dipped into a buffered hydrofluoric acid solution (a $NH_4F+HF$ mixed solution). As such, a wet etching is applied to the SiC substrate 1. Through the above processes, the gate window 6 is formed at a predetermined position in the field insulating film 3, as shown in FIG. 3B. This wet etching process causes the first transitory thermally-oxidized film 201 to disappear. In cases where a fine gate window 6 is formed, a dry etching process, such as a reactive ion-etching process with tetrafluoromethane ($CF_4$) gas plasma can be used. In such cases, however, the dry etching process is first applied and then the wet etching process using the aforementioned buffered hydrofluoric acid solution is applied when the field insulating film with a thickness of tens of nanometers is left. This is desirable because if the gate window 6 penetrates through the field insulating film 3 by the dry etching process, then this causes plasma-induced damage on the surface of the SiC substrate such that the surface of the SiC substrate is roughened. Such a roughened surface causes degradation of the characteristics of the gate insulating film 9, which is formed in the ensuing process. When the etching of the gate window 6 is completed, the photoresist is removed to result in the structure of FIG. 3B.

Then, the SiC epitaxial substrate 1 is cleaned once again by another RCA cleaning process or the like. In the final step of the cleaning process, in order to remove the chemically oxidized film formed on the surface of the opening portion by the cleaning process, the SiC epitaxial substrate 1 is dipped in the buffered hydrofluoric acid solution for 5 to 10 seconds. Thereafter, the SiC epitaxial substrate 1 is completely cleaned of the buffered hydrofluoric acid solution through the use of ultrapure water and is subsequently dried.

Figure 3C:
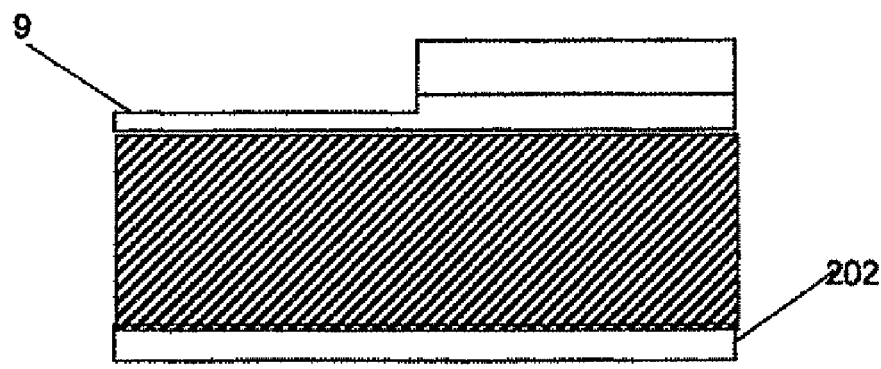

The SiC epitaxial substrate 1 is thermally oxidized after the SiC epitaxial substrate 1 dries up. As such, the gate oxide film 9 is grown on the surface of the epitaxial layer at the bottom of the gate window 6, as shown in FIG. 3C. A condition for the gate oxidation process may be dry oxidation at a temperature of 1,160° C., for example. Oxygen, nitrous oxide $N_2O$ gas, nitric oxide NO gas or nitrogen dioxide $NO_2$ gas, which has a low dew point, is adequate as the oxidation gas of the dry oxidation. Further, a mixed gas formed by diluting the oxidation gas of a low dew point with an inert gas (argon Ar or nitrogen $N_2$) of a low dew point may be adequate as the oxidation gas of the dry oxidation. An oxidation temperature of 1,000° C. to 1,280° C. provides a good result.

Figure 4:
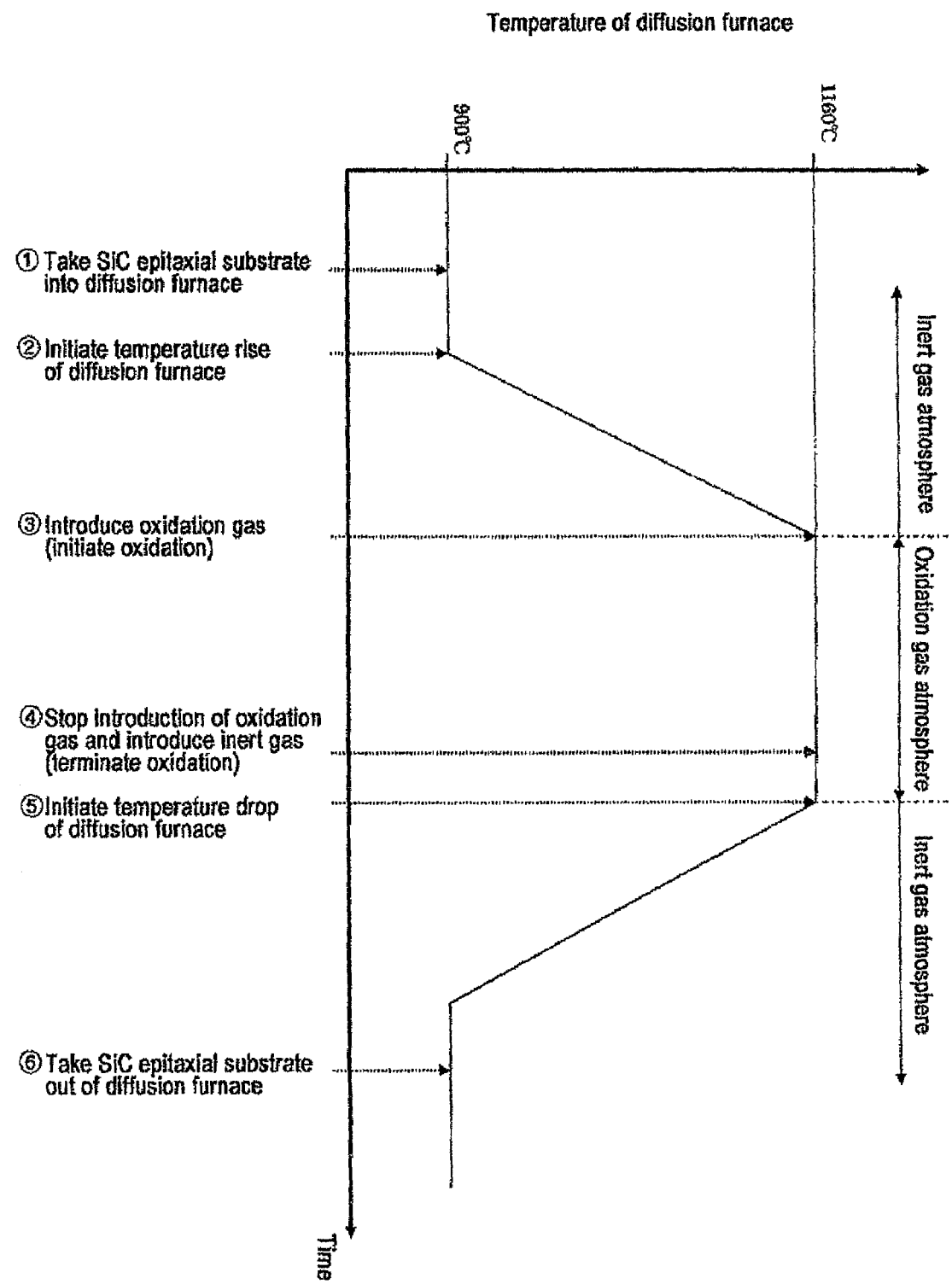
FIG. 4 is a time line of the process of manufacturing of the first embodiment.

A process of forming the gate oxide film 9 is further explained below with reference to FIG. 4. In step one, the SiC epitaxial substrate 1 is taken to a diffusion furnace, which is filled with inert gas and is maintained at a sufficiently low temperature (e.g., 900° C.), at which SiC oxidation is not practically achieved. In step two, the diffusion furnace is heated to raise the temperature of the diffusion furnace to the oxidation temperature in an inert gas atmosphere. In step three, when the temperature of the diffusion furnace rises such that the temperature of the SiC epitaxial substrate 1 reaches the oxidation temperature (e.g., 1,160° C.), the temperature of the diffusion furnace is stabilized. Further, the oxidation gas (e.g., $O_2$ of a low dew point) is introduced to initiate thermal oxidation. Subsequently, in step four, when the thickness of the thermal oxide film reaches a target thickness, the introduction of the oxidation gas is stopped. Also, the introduction of the inert gas is initiated to terminate the thermal oxidation of the SiC epitaxial substrate 1. When the diffusion furnace is filed with the inert gas, the temperature of the diffusion furnace is dropped in step five. When the temperature of the diffusion furnace reaches a temperature (e.g., 900° C.), at which the SiC thermal oxidation is not practically achieved, the SiC epitaxial substrate 1 is taken out of the diffusion furnace in step six.

As mentioned previously, in step three when the temperature of the SiC epitaxial substrate reaches the oxidation temperature, the temperature of the diffusion furnace is stabilized and the introduction of the oxidation gas is initiated. However, if the temperature of the SiC epitaxial substrate 1 is more than 1,000° C., the TDDB life of the gate insulating film can be extended. Thus, when the temperature of the SiC epitaxial substrate 1 exceeds 1,000° C. even while raising the temperature of the diffusion furnace, the thermal oxidation may be initiated by performing the introduction of the oxidation gas. If heat treatment is applied at a temperature of more than 1,000° C. in a post process, the reference temperature of 1,000° C. is substituted by the heating temperature.

In step five, when the diffusion furnace is filled with the inert gas, the temperature of the diffusion furnace is dropped. However, if the diffusion furnace is filled with the inert gas before the temperature of the diffusion furnace is dropped below 1,000° C., then the TDDB life of the gate insulating film can be extended. Thus, depending on the time until the diffusion furnace is filled with the inert gas after the introduction of the oxidation gas is stopped, as well as the time until the temperature of the diffusion furnace becomes 1,000° C., which is determined by a temperature reduction rate of the diffusion furnace, the temperature drop process may be initiated earlier. Again, if heat treatment is applied at a temperature of more than 1,000° C. in a post process, the reference temperature of 1,000° C. is substituted by the heating temperature.

Figure 5A:
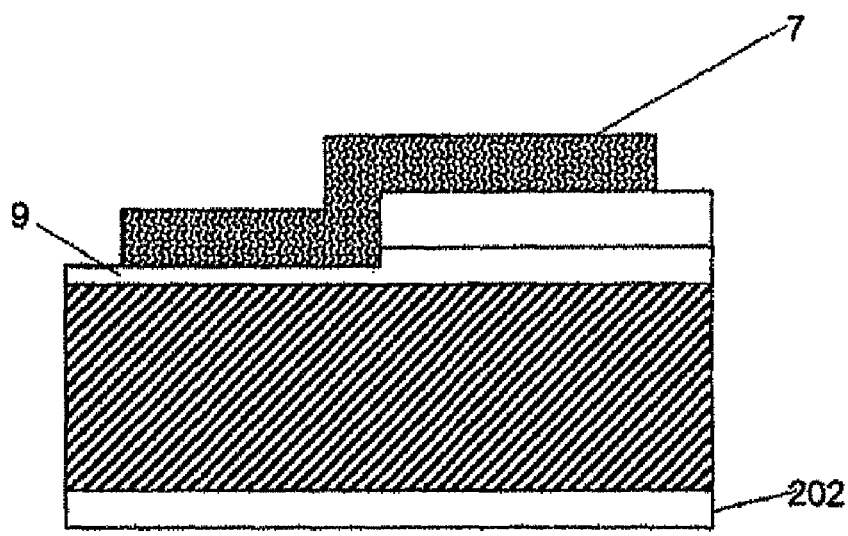
FIGS. 5A and 5B are sectional views of the semiconductor device of the first embodiment shown in stages of a process of manufacturing the device.

Referring now to FIG. 5A, a second transitory SiC thermally-oxidized film 202 is naturally formed on the back surface of substrate 1 by the SiC thermal oxidation. Similar to the first transitory thermally-oxidized film 201, the second transitory SiC thermally-oxidized film 202 effectively removes the grinding-induced damaged layer. In addition, the second transitory SiC thermally-oxidized film 202 protects the back surface of the substrate 1 from damage due to dry etching for removing the polycrystalline Si from the back surface of the substrate, which will be described in the ensuing process. If the back surface of the substrate 1 is not protected by the oxidized film, then the crystallinity of the back surface of the substrate 1 can be disturbed. As a result, the contact resistance of a back-surface electrode 10 is increased.

When the gate oxide film 9 is completely formed, a polycrystalline silicon film with a thickness of 300 nm to 400 nm is formed on the entire upper surface and the entire back surface of the SiC epitaxial substrate 1 by a low pressure CVD process using a silane material at a growth temperature of 600° C. to 700° C. Then, phosphorus (P) is added to the polycrystalline silicon film by a generally well-known thermal diffusion method using phosphorus chloride oxide ($POCl_3$) and oxygen at a processing temperature of 900° C. to 950° C. so as to provide conductivity. The ion implantation may be used for the doping into the polycrystalline silicon film. Also, the conduction type of the doping may be p-type.

Thereafter, the upper surface of the epitaxial substrate 1 is coated with photoresist and exposed to light to form a mask. The polycrystalline Si is etched by a reactive ion-etching (RIE) process using sulfur hexafluoride $SF_6$, thereby forming the polycrystalline Si gate electrode 7. After the resist used in the RIE process is completely removed, the entire upper surface of the SiC substrate 1 is coated once again with photoresist having a thickness of 1 μm or more. This is to protect the upper surface of the SiC substrate 1. A dry etching process is applied to the back surface of the SiC substrate 1 to remove the polycrystalline Si film deposited on the back surface of the SiC substrate 1. Then, the resist material used for protecting the upper surface of the SiC substrate 1 is removed. As a result, a sectional structure as shown in FIG. 5A is obtained.

Figure 5B:
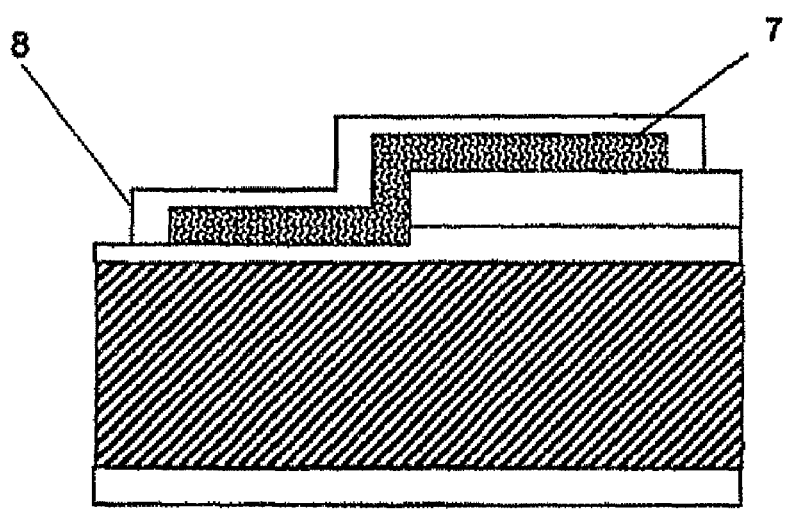

Subsequently, the SiC epitaxial substrate 1 is cleaned once again by the RCA cleaning process or the like and is then dried. Thereafter, the SiC epitaxial substrate 1 is oxidized by a wet oxidation process (pyrogenically oxidized) at a temperature of 950° C., As shown in FIG. 5B, the polycrystalline Si thermally-oxidized film 8 is grown on the side surface and the upper portion of the polycrystalline Si gate electrode 7.

The gate oxide film near the outer periphery of the polycrystalline Si gate electrode 7 is damaged by the etching of the polycrystalline Si gate electrode 7, and the reliability is deteriorated. Without any treatment, the TDDB would occur at this part in a short time. By growing the polycrystalline Si thermally-oxidized film 8 through the thermal oxidation of the gate electrode 7 as described, the outer periphery of the gate electrode 7 retreats inwardly in a very uniform manner. Accordingly, the etching-induced damaged portion of the gate oxide film is spaced away from the gate electrode 7, and the deteriorated reliability of the gate oxide film is restored to its original state.

Figure 6A:
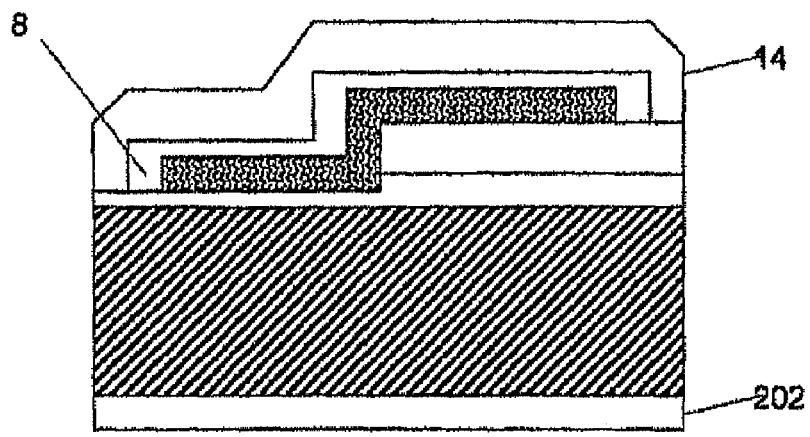
FIGS. 6A and 6B are sectional views of the semiconductor device of the first embodiment shown in stages of a process of manufacturing the device.

After the polycrystalline Si thermally-oxidized film 8 is formed, the interlayer insulating film 14 is deposited on the entire upper surface of the SiC epitaxial substrate 1, shown in FIG. 6A). Suitable as the material of the interlayer insulating film 14 is a $SiO_2$ film with a thickness of approximately 1 μm, which can be deposited by an atmospheric pressure CVD process using silane and oxygen as materials. Also suitable is a phosphorus silicate glass (PSG) with a thickness of approximately 1 μm, which can be obtained by further adding phosphorus (P) to the $SiO_2$ film. However, the material of the interlayer insulating film 14 is not limited to the $SiO_2$ film or PSG. Any other material may be used as long as it can go through the following heat treatment processes. Thereafter, the substrate is put into a generally-used diffusion furnace. An appropriate heat treatment is applied to the substrate in a $N_2$ atmosphere for tens of minutes to highly densify the interlayer insulating film 14. At this time, a heat treatment temperature is appropriately chosen to be lower (e.g., 950° C.) than the gate oxidation temperature previously described.

Subsequently, the upper surface of the epitaxial substrate 1 is coated with photoresist and a post bake is applied sufficiently thereto, thus completely vaporizing the volatile components of the resist. The SiC epitaxial substrate 1 is dipped into the buffered hydrofluoric acid solution. As such, the second transitory SiC thermally-oxidized film 202 remaining on the back surface of the substrate 1 is completely removed. Then, the substrate is cleaned of the buffered hydrofluoric acid solution through the use of ultrapure water. The terminated surface of the back surface of the SiC substrate thus exposed is a clean surface free of damage or contamination.

The SiC epitaxial substrate 1, which is wet with ultrapure water, is dried. Immediately after drying, the SiC epitaxial substrate 1 is put into a deposition system that is kept in high vacuum. Thus, a desired ohmic contact base material is deposited on the back surface of the substrate. For example, a Ni film with a thickness of 50 nm to 100 nm can be used as the ohmic contact base material.

Figure 6B:
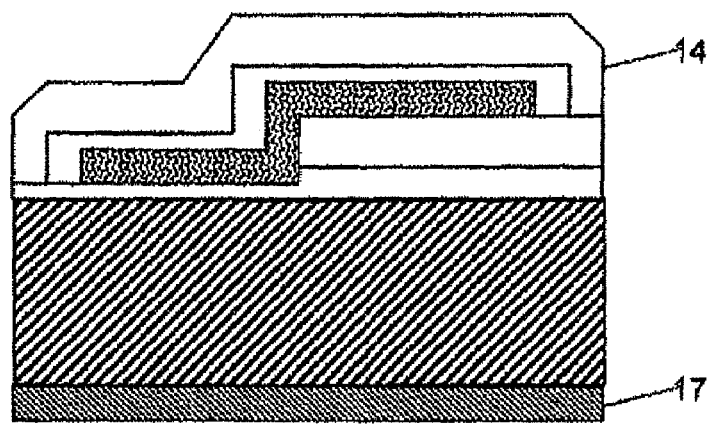

After the ohmic contact base material is deposited, the resist on the upper surface of the substrate is completely removed with a specialized stripper solution. The substrate is fully cleaned and dried. Immediately after drying, the substrate is mounted into a rapid thermal annealing system. Thus, a contact annealing process is applied to the substrate in a 100% pure Ar atmosphere at 1,000° C. for two minutes. Through such heat treatment, as shown in FIG. 6B, the Ni film is alloyed with the low-resistance SiC substrate, which is made into silicide. As a result, the ohmic contact 17 with an extremely low resistance and a contact resistance in the order of at least $10^{-6}$ $\Omega cm^2$ is obtained.

Figure 7A:
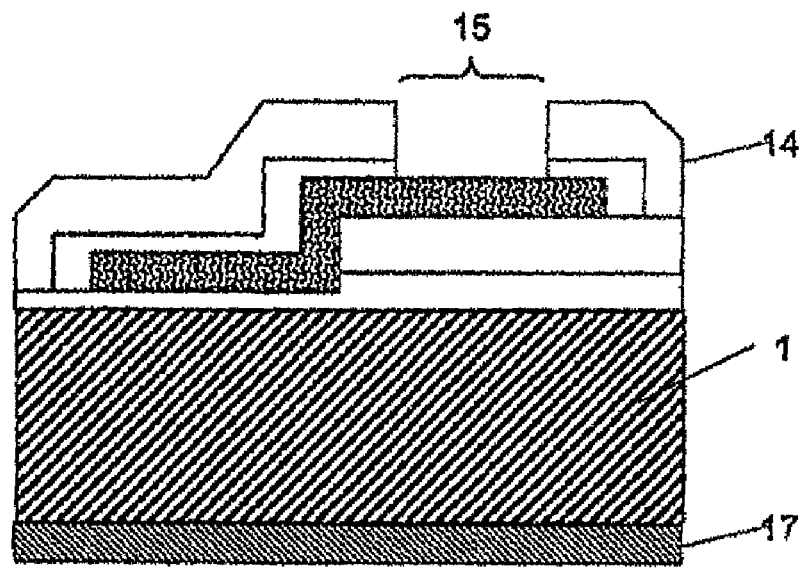
FIGS. 7A and 7B are sectional views of the semiconductor device of the first embodiment shown in stages of a process of manufacturing the device.

Referring to FIG. 7, the upper surface of the substrate 1 is coated with photoresist and then exposed to light and developed by using an exposure system. Thus, a resist mask is formed through which the gate contact window 15 is opened in the interlayer insulating film 14. Thereafter, the entire back surface of the substrate is coated with photoresist as a protecting film and is then fully dried. An etching process is performed by using the buffered hydrofluoric acid solution so that the gate contact window 15 is opened in the interlayer insulating film 14 and the polycrystalline Si thermally-oxidized film 8. The photoresist on the back surface of the substrate prevents the ohmic contact 17 from disappearing or deteriorating as a result of the ohmic contact 17 being liquated in the buffered hydrofluoric acid solution. In addition, the photoresist on the back surface of the substrate prevents the upper surface of the SiC epitaxial substrate 1 from being contaminated by the ohmic contact material that would otherwise be liquated from the back surface of the substrate 1. After the photoresist is completely removed by a specialized stripper solution, a structure as shown in FIG. 7A is obtained.

Subsequently, the substrate is fully cleaned and dried. Then, the substrate is quickly put into a magnetron sputtering system kept under vacuum where a desired wiring material such as aluminum Al with a thickness of 1 μm is deposited on the entire upper surface of the SiC epitaxial substrate 1.

Figure 7B:
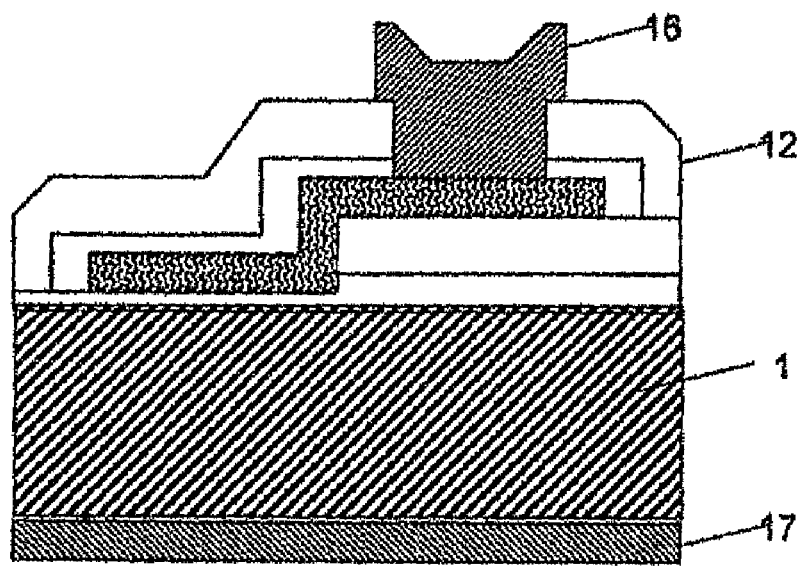

Thereafter, the upper surface of the substrate 1 on which the Al film is formed is coated with photoresist. The photoresist is then exposed to light and developed so as to form a resist mask. The back surface of the substrate 1 is again coated with photoresist for protecting the back-surface electrode. After the resist is fully dried, the Al film is patterned by using a phosphoric-acid-containing etching solution, and the interconnection 16 is formed as shown in FIG. 7B. The Al film may be patterned by a dry etching process such as RIE or the like. The resist on the back surface of the substrate can prevent the ohmic electrode 17 on the back surface from disappearing or degenerating as a result of the ohmic electrode 17 being liquated in the phosphoric-acid-containing etching solution. However, in the case where it is unlikely that the back-surface electrode may disappear or degenerate, or in the case where the Al film is etched by the RIE process, the resist on the back surface of the substrate can be omitted.

Finally, the resist mask and the resist used for protecting the back-surface electrode are completely removed by using a specialized stripper solution. Thereafter, the substrate is fully cleaned and dried. Thus, a final structure as shown in FIG. 7B is obtained. As such, the silicon carbide semiconductor device with the ONO-filmed MIS structure according to the first embodiment is completed.

Figure 8:
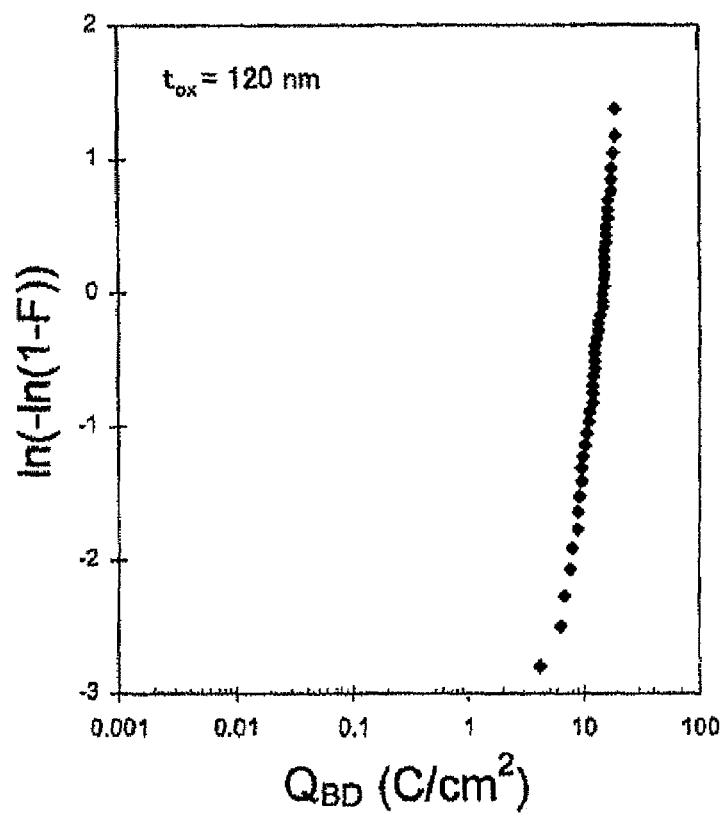
FIG. 8 is a time dependent dielectric breakdown (TDDB) characteristic diagram of a gate oxide film of the semiconductor device in accordance with the first embodiment.

FIG. 8 shows the results of a TDDB test under a constant current stress performed on 50 samples of the MOS embodiment disclosed above. A Weibull graph of FIG. 8 is obtained by plotting a distribution of charge density $Q_{BD}$ per unit area (C/cm²), which has passed through the gate insulating film until a TDDB occurred in the MOS structure according to the first embodiment, as a function of a cumulative failure rate F.

The gate oxide film of the MOS structure used in this test has a thickness of 12 nm, and the gate electrode has a diameter of 200 µm. An area of the gate electrode is substantially equal to that of known devices (see the test results in Table 1). Also, the stress current in this test is set to be 10 mA/cm².

As seen in FIG. 8, the durability (lifespan) against the TDDB was remarkably improved compared to Table 1. Further, when deriving MCTB (a median of a TDDB life $Q_{BD}$) from FIG. 8, 12.8=10 C/cm² could be obtained. This value is higher by at least one order of magnitude than the highest MCTB shown in table 1. In other words, the first embodiment can solve the problem of an extremely short lifespan against the TDDB.

Figure 9:
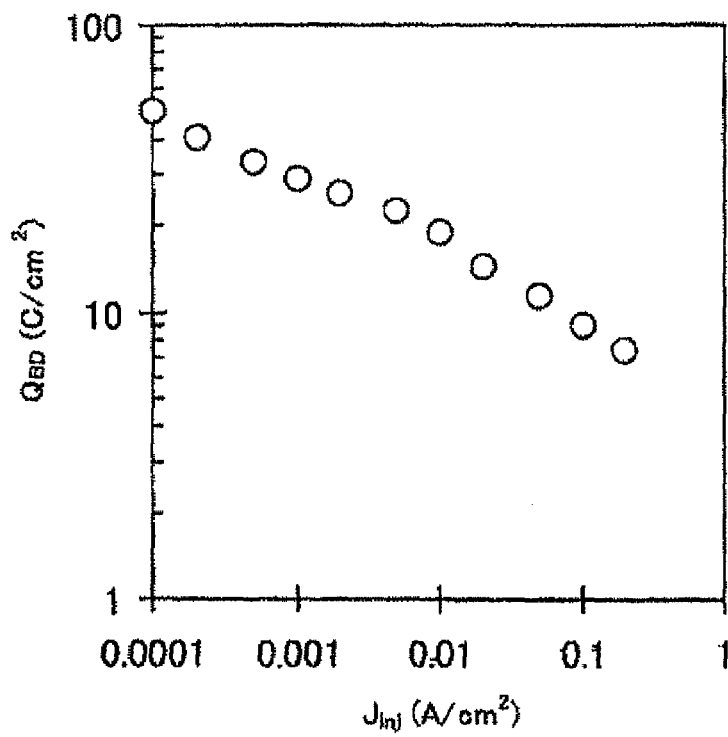
FIG. 9 is a characteristic diagram of total charge quantity per unit area ($Q_{BD}$) for a gate insulating film of the semiconductor device in accordance with the first embodiment.

FIG. 9 shows a relation between the maximum value of the $Q_{BD}$ life of the MOS structure plotted in FIG. 8 and the current stress $J_{inj}$. As the current stress is decreased, the $Q_{BD}$ life is increased exponentially. When the current stress $J_{inj}$ equals $10^{-4}$ A/m² ($J_{inj}$=$10^{-4}$ A/m²), the $Q_{BD}$ is higher than 50 C/cm² ($Q_{BD}$>50 C/cm²). The intensity of the gate electric field of the actual MOS device is about 3 MV/cm at most. Further, the current density flowing in the gate oxide film is much smaller than $10^{-4}$ A/m². As understood from the foregoing descriptions, the MOS structure of the first embodiment has a very high $Q_{BD}$ lifespan of more than 50 C/cm², which is higher than the MCTB of known devices, under the stress practically applied to the device.

Figure 10:
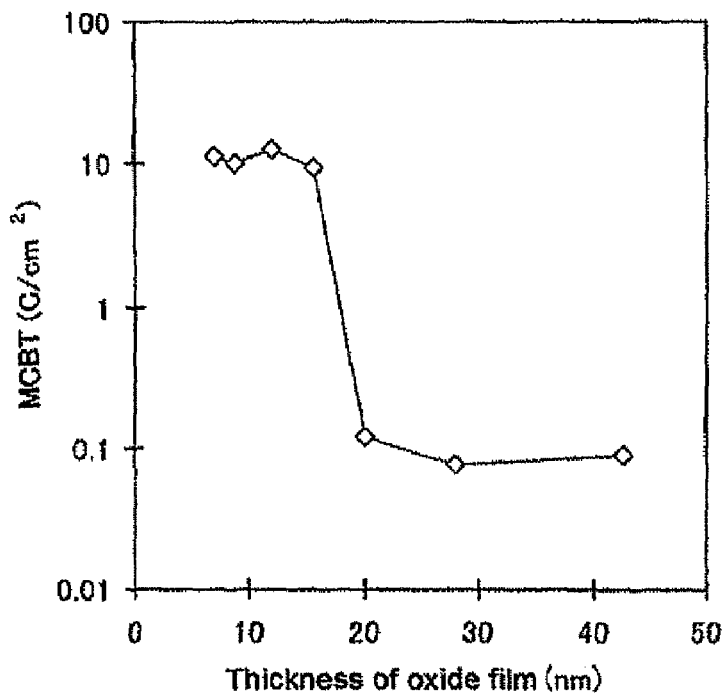
FIG. 10 is a characteristic diagram showing a relation between a thickness of the gate oxide film and a median of life of total charge quantity per unit area.

Through repeated verification, the inventor has found that the improvement of the $Q_{BD}$ lifespan depends considerably on the thickness of the gate oxide film. FIG. 10 shows a relation between the thickness of the gate oxide film and MCTB (the median of the $Q_{BD}$ lifespan). When the thickness of the gate oxide film is decreased below about 20 nm, the improvement effect starts to appear dramatically. When the thickness of the gate oxide film is decreased below 15 nm, MCTB and the $Q_{BD}$ lifespan equivalent to FIG. 8 can be stably obtained.

It was unexpectedly discovered that the improvement effect occurs clearly only when the MOS structure and its manufacturing method are achieved according to the method taught herein. For example, in the case where the polycrystalline Si thermally-oxidized film is not formed, or in the case where the thermal oxidation method is changed, MCTB equivalent to the data for known devices in Table 1 is obtained.

Next, the effect of restraining the extension of the $Q_{BD}$ distribution of the first embodiment is explained. As understood from FIG. 8, the $Q_{BD}$ distribution of the 50 samples falls within a range of one order of magnitude. In Table 1, when MCTB was intended to be enhanced, the $Q_{BD}$ distribution tended to be remarkably extended. Such a tendency was disadvantageous in the large-scale MOS structure as yield is decreased. However, the first embodiment described herein enhances MCTB and restrains the extension of the $Q_{BD}$ distribution at the same time. According to the discoveries by the present inventor, similar to the MCTB improvement effect, the $Q_{BD}$ distribution restraining effect appears when the thickness of the gate oxide film is decreased below about 20 nm. When the thickness of the gate oxide film is decreased below 15 nm, the $Q_{BD}$ distribution falls within a range of one order of magnitude.

Figure 11:
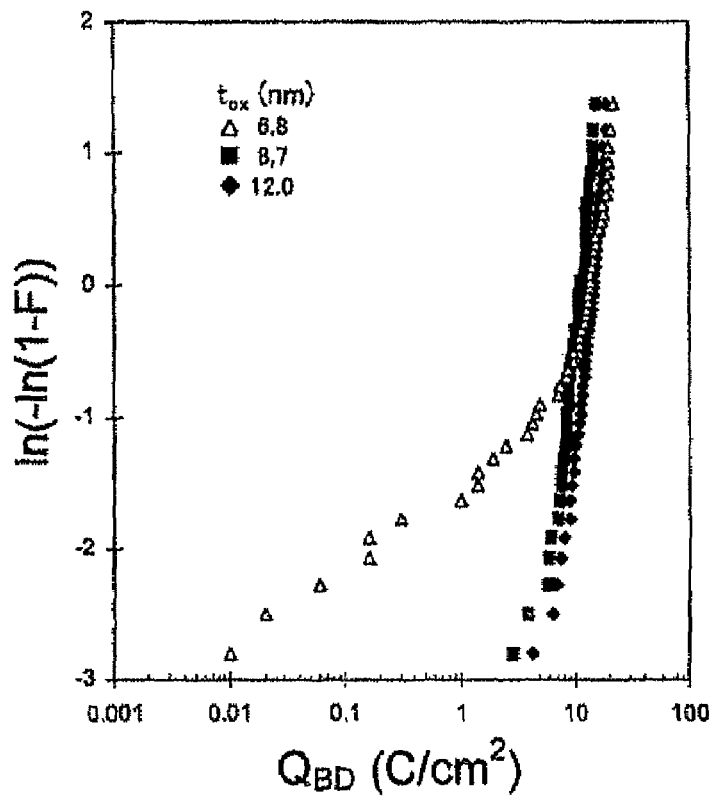
FIG. 11 is a time dependent dielectric breakdown characteristic diagram of a gate insulating film of the semiconductor device in accordance with the first embodiment.

FIG. 11 shows the results of a case where a film pressure of the gate oxide film is respectively set to 6.8 nm, 8.7 nm and 12.0 nm. As shown in FIG. 11, optimal characteristics are obtained under the conditions of 8.7 nm and 12.0 nm. However, if the thickness of the gate oxide film is thinner than 8 nm, such as 6.8 nm, the $Q_{BD}$ distribution tends to be gradually extended. However, this result is derived from a case where a total gate area of the MOS structure corresponds to that of the aforementioned test sample, a generally-used size as shown in Table 1. In the case where the total gate area is smaller, this result will be decreased. Accordingly, even when the film thickness is smaller than 8 nm, the preferred characteristics can be obtained.

A second embodiment is directed to an n-channel type planar power MOS field-effect transistor cell, hereinafter MOSFET. This embodiment can be applied to a square cell, a hexagonal cell, a round cell, a linear cell, etc.

Figure 12:
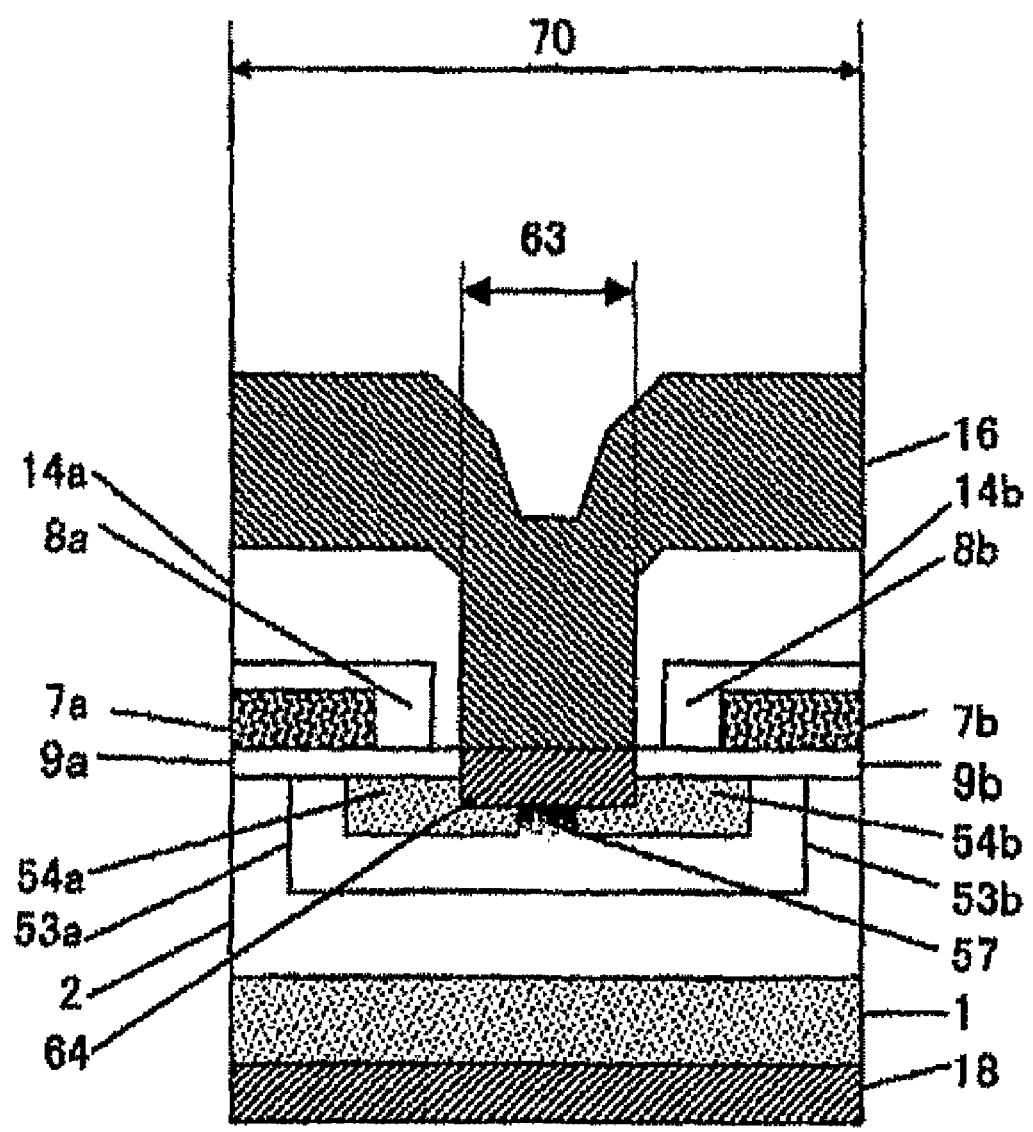
FIG. 12 is a sectional view of a part of a semiconductor device in accordance with a second embodiment of the invention.

FIG. 12 is a sectional view showing a chief part of the power MOSFET cell according to the second embodiment. A first n⁻ epitaxial layer 2 with a thickness of 10 µm is grown homoepitaxially on the upper surface of a n⁺ single crystal SiC substrate 1. Nitrogen is doped to the first n⁻ epitaxial layer 2 at a concentration of $1 \times 10^{16}$/cm³. The second embodiment can be applied to a substrate, no matter what crystal system the substrate may have, including 4H, 6H, 3C and 15R (H represents a hexagonal system, C represents a cubic system and R represents a rhombohedral system). P-base regions 53a and 53b with a predetermined depth, to which a small amount of p-type impurities are doped, are formed at predetermined regions in the surface layer of the n⁻ epitaxial layer 2.

N⁺ source regions 54a and 54b, which have smaller depths than the p-base regions 53a and 53b, are formed in predetermined regions in the surface layer of the p-base regions 53a and 53b. The n⁺ source regions 54a and 54b extend from the outer boundaries of the p-base regions 53a and 53b at a predetermined distance. A p⁺ base contact region 57 is arranged in the surface layer of the substrate in the middle between the p-base regions 53a and 53b in such a way that the p⁺ base contact region 57 has a smaller depth than each of the p-base regions 53a and 53b and is interposed between the n⁺ source regions 54a and 54b.

Gate oxide films 9a and 9b are formed selectively on the upper surface of the substrate. Gate electrodes 7a and 7b made of polycrystalline Si, to which conductivity is provided, are provided on the gate oxide films 9a and 9b. Polycrystalline Si thermally-oxidized films 8a and 8b are formed on upper portions and side walls of the polycrystalline Si gate electrodes 7a and 7b.

Interlayer insulating films 14a and 14b are formed on the SiC substrate including the polycrystalline Si thermally-oxidized films 8a and 8b. Source window 63 is opened in the interlayer insulating films 14a and 14b. The source window 63 is opened in such a way that the source window 63 penetrates through the $n^+$ source regions 54a and 54b and the $p^+$ base contact region 57. A source contact 64 exists at the bottom of the source window 63. The source contact 64 is formed by selectively arranging a base material in the form of a thin metal film, such as Ni, at the bottom of the source window 63, and then by alloying the base material with SiC by a rapid thermal annealing. The source contact 64 forms its ohmic contact with the $n^+$ source regions 54a and 54b and the $p^+$ base contact region 57 at the same time. The back surface 18 of the substrate is a drain contact, which is formed by the same method as the source contact 64. An interconnection 16 connects the source contact 64 with other circuit components on the same substrate or with external circuits through the source window 63.

Next, a method of manufacturing the planar power MOSFET cell according to the second embodiment is explained with reference to FIGS. 13A to 15C.

The $n^+$ SiC substrate 1 is prepared by homoepitaxially growing the $n^-$ epitaxial layer 2 on the principal surface of the substrate 1. A CVD oxide film 20 with a thickness of 20 nm to 30 nm is deposited on the surface of the $n^-$ epitaxial layer 2. Thereafter, polycrystalline Si with a thickness of approximately 1.5 µm (as a material for a mask of an ion implantation process) is formed on the CVD oxide film 20 by a low pressure chemical vapor deposition (LPCVD) method. $SiO_2$, phosphorus silicate glass (PSG) or the like, each of which is formed by a CVD process, can be used instead of polycrystalline Si. The CVD oxide film 20 can be omitted. However, when polycrystalline Si is intended to be used as a material for a mask of an ion implantation process, the CVD oxide film 20 (1) serves as a protection film for preventing the polycrystalline Si and the $n^-$ epitaxial layer 2 from interacting with each other in an unexpected manner; (2) detects an end point in a case where the polycrystalline Si mask material is etched anisotropically and serves as an etching stopper film; and (3) serves as a film for protecting a surface when p-base dopants are ion implanted.

Subsequently, the polycrystalline Si film on a region where a p-base region is intended to be formed is removed vertically by using a photolithography process and an anisotropic etching process such as a reactive ion etching (RIE) process. As such, first ion-implantation masks 21a and 21b are formed. If an etchant gas such as $SF_6$ is used when the polycrystalline Si film is etched by the RIE process, the thermal oxide film can be etched with a high selective etching ratio. Further, an end point of etching can be detected. Accordingly, plasma-induced damage that would otherwise occur on the upper surface of the substrate, especially on the channel region, can be avoided.

Figure 13A:
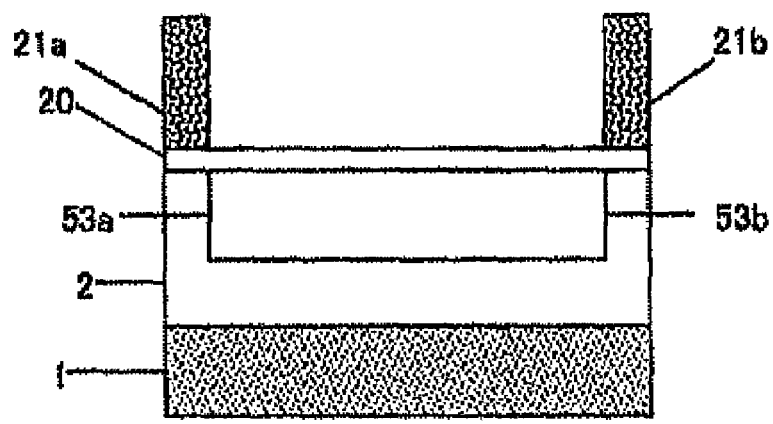
FIGS. 13A to 13C are sectional views of the semiconductor device of the second embodiment shown in stages of a process of manufacturing the device.

As shown in FIG. 13A, p-type impurities are ion implanted into the $n^-$ epitaxial layer 2, forming the p-base regions 53a and 53b. Although the polycrystalline Si is actually deposited to the back surface of the epitaxial substrate 1, the polycrystalline Si thus deposited is not illustrated in FIG. 13. Examples of conditions under which ions are implanted into the p-base regions 53a and 53b are as follows:
Dopants: $Al^+$ ions;
Substrate temperature: 750° C.; and
Acceleration voltage/dose: 360 keV/5×10$^{-13}$ cm$^{-3}$.

After the ions are implanted into the p-base regions 53a and 53b, the CVD oxide film 20 and the first ion-implantation masks 21a and 21b are removed by a wet etching process.

Figure 13B:
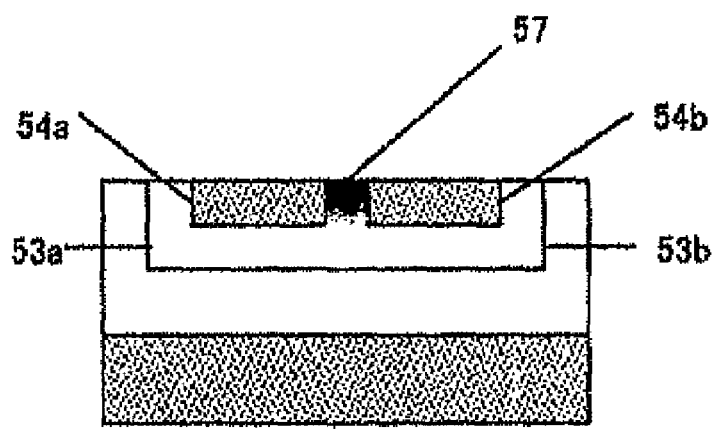

Subsequently, as shown in FIG. 13B, the $n^+$ source regions 54a and 54b and the $p^+$ base contact region 57 are formed by using the same procedure as the ions have been selectively implanted into the p-base regions 53a and 53b. Examples of conditions under which the ions are selectively implanted into the $n^+$ source regions 54a and 54b are as follows:
Dopants: $P^+$ ions;
Substrate temperature: 500° C.; and
Acceleration voltage/dose: 160 keV/2.0×10$^{15}$ cm$^{-2}$;
100 keV/1.0×10$^{15}$ cm$^{-2}$;
70 keV/6.0×10$^{14}$ cm$^{-2}$; and
40 keV/5.0×10$^{14}$ cm$^{-2}$.

In addition, examples of conditions under which the ions are selectively implanted into the $p^+$ base contact region 57 are as follows:
Dopants: $Al^+$ ions;
Substrate temperature: 750° C.; and
Acceleration voltage/dose: 100 keV/3.0×10$^{15}$ cm$^{-2}$;
70 keV/2.0×10$^{15}$ cm$^{-2}$;
50 keV/1.0×10$^{15}$ cm$^{-2}$; and
30 keV/1.0×10$^{15}$ cm$^{-2}$.

After all the ion implantation processes are completed, the substrate is dipped into a mixed solution of hydrofluoric acid and nitric acid. Thus, all of the masks used and all of the unnecessary mask materials deposited to the back surface of the substrate are completely removed. When the masks are removed, the substrate can be alternately dipped into a thermal phosphoric acid solution and a BHF solution so that the polycrystalline Si and the $SiO_2$ are removed sequentially.

The substrate from which the masks have been removed is cleaned and dried. Thereafter, the substrate is thermally treated in an atmospheric pressure, pure Ar atmosphere at a temperature of 1,700° C. for one minute. Thus, all of the conductive dopants, which have been ion implanted into the p-base regions 53a and 53b, the $n^+$ source regions 54a and 54b and the $p^+$ base contact region 57, are activated at once.

The substrate, which has been fully cleaned by using an RCA cleaning process, is thermally oxidized in a dry oxygen atmosphere. Thus, thermal oxide films are grown on the upper surface and the back surface of the substrate. Immediately after the growth is completed, the thermal oxide films are removed by using a buffered hydrofluoric acid solution. It is advantageous that the thickness of each of the sacrificial oxide films is less than 50 nm, preferably from 5 nm to 20 nm. The substrate on which the sacrificial oxidation process has been completed is fully cleaned once again by the RCA cleaning process. Thereafter, a thick insulating film is formed on the upper surface of the substrate by using a thermal oxidation process, a CVD process or the like. Subsequently, an element region 70 (shown in FIG. 12), from which a field region where the thick oxide film exists and the thick oxide film is removed, is formed by using a generally-known photolithography process and a wet etching process or a dry etching process. However, the shape of the element region 70 in FIG. 12 is different from the shape represented by FIG. 13, where the element region is not shown. This is because the field region including the lower insulating film 4 and the upper insulating film 5 is formed at the outer portion around the element region by using the same method as the first embodiment.

Figure 13C:
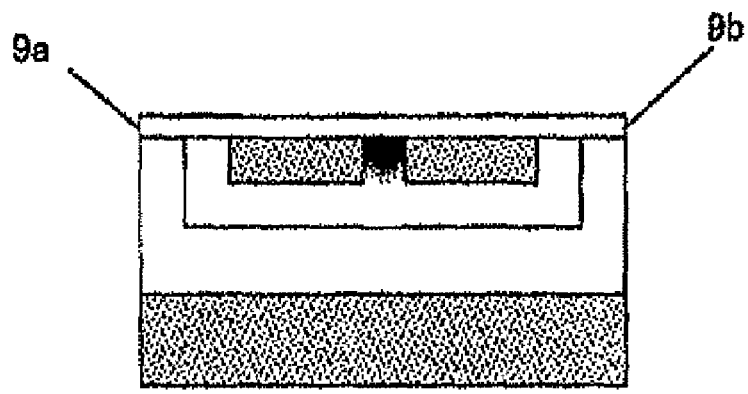

Then, the substrate is fully cleaned once again by using the RCA cleaning process. At the final stage of this cleaning process, the substrate is dipped in a diluted hydrofluoric acid solution for 5 to 10 seconds to remove a chemical oxide film (SiO$_2$) that has been formed on the surface of the element region 70. Subsequently, the substrate is completely cleaned of the diluted hydrofluoric acid solution by using ultrapure water and is then dried. Immediately after drying, the substrate is thermally oxidized so that the gate oxide films 9a and 9b are grown on the surface of the substrate in the element region 70. As a result, the structure shown in FIG. 13C is obtained.

The conditions and method of the gate oxidation as well as the thickness of the gate oxide film of the second embodiment are the same as those of the first embodiment. In this respect, it is an important point that the gate oxidation temperature is set higher than any other heat treatment temperature in the following processes. In this embodiment, a rapid heating process is later performed at a temperature of 1,000° C. to achieve an ohmic contact between the source contact electrode 64 above the upper surface of the substrate and the drain electrode 17 on the back surface of the substrate. Thus, 1,160° C., which is higher than the above temperature, is chosen to be the oxidation temperature by example.

Figure 14A:
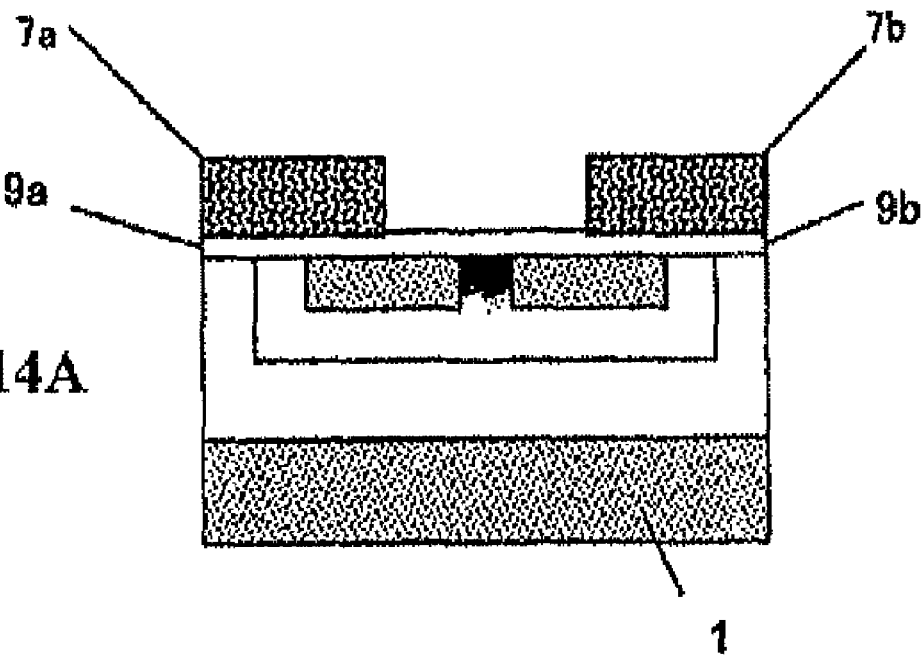
FIGS. 14A and 14B are sectional views of the semiconductor device of the second embodiment shown in stages of a process of manufacturing the device.

Thereafter, a polycrystalline Si film with a thickness of 300 nm to 400 nm is formed on the entire upper surface and the entire back surface of the substrate by a low pressure CVD process using a silane material at a growth temperature of 600° C. to 700° C. Then, phosphorus (P) is doped to the polycrystalline Si film by a generally well-known thermal diffusion method using phosphorus chloride oxide (POCl$_3$) and oxygen at a processing temperature of 900° C. to 950° C., providing conductivity. Then, the upper surface of the substrate is coated with photoresist. The polycrystalline Si film above the upper surface of the substrate is patterned by using a photolithography process and a reactive ion etching (RIE) process, which uses hexafluoroethane C$_2$F$_6$ and oxygen as etchants. Thus, the structure shown in FIG. 14A is obtained. In this step, the gate electrodes 7a and 7b are defined. Incidentally, the polycrystalline Si film is also formed on the back surface of the epitaxial substrate 1. However, this polycrystalline Si film is not illustrated in FIG. 14A.

Figure 14B:
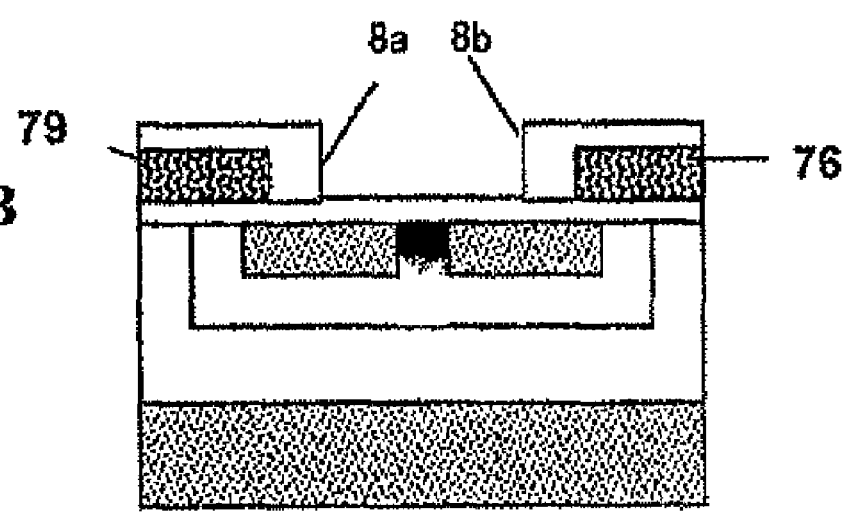

Subsequently, the SiC epitaxial substrate 1, which has been etched by using the RIE process, is cleaned by an RCA cleaning process and is then dried. The SiC epitaxial substrate 1 is oxidized by a wet oxidation process (pyrogenically oxidized) at a temperature of 950° C. As shown in FIG. 14B, the polycrystalline Si thermally-oxidized films 8a and 8b are grown on the upper surfaces and the side surfaces of the polycrystalline Si gate electrodes 7a and 7b. Through these processes, the reliabilities are improved by oxidizing the outer end of the polycrystalline Si to position the outer end of the polycrystalline Si inwardly. This is so that a strong electric field is not applied to a portion of the gate oxide film, which is damaged by the polycrystalline Si gate etching. In addition, since the polycrystalline Si thermally-oxidized films 8a and 8b are formed not only on the side walls of the gate electrodes but also on the upper surfaces of the gate electrodes, the thickness of each of the polycrystalline Si gate electrodes is decreased. As such, taking this decrease into consideration, the initial thickness of each of the polycrystalline Si gate electrodes 7a and 7b is defined.

Figure 15A:
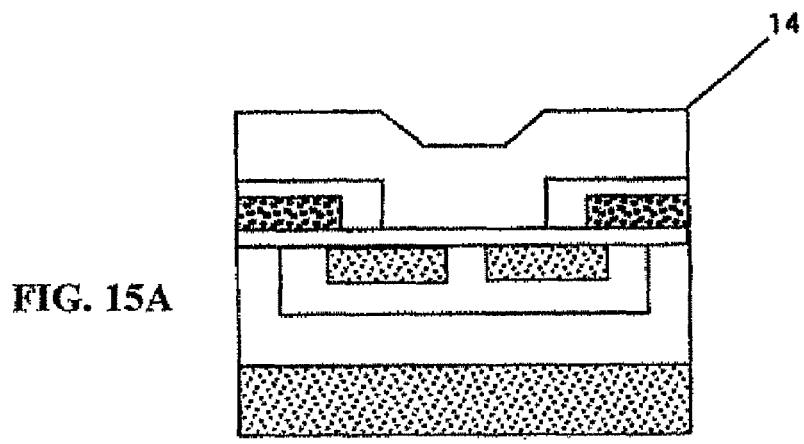
FIGS. 15A to 15C are sectional views of the semiconductor device of the second embodiment shown in stages of a process of manufacturing the device.

Subsequently, as shown in FIG. 15A, the interlayer insulating film 14 is deposited on the entire upper surface of the substrate. A SiO$_2$ film (NSG) with a thickness of approximately 1 μm (formed by an atmospheric pressure CVD process using silane and oxygen as materials), phosphorus silicate glass (PSG) with a thickness of approximately 1 μm (obtained by further adding phosphorus (P) to the SiO$_2$ film) and boron phosphorus silicate glass (BPSG) with a thickness of approximately 1 μm (obtained by further adding boron to the PSG) are suitable as materials for the interlayer insulating film 14. However, it should be noted that the materials for the interlayer insulating film 14 are not limited to the SiO$_2$ film, phosphorus silicate glass or boron phosphorus silicate glass. Thereafter, the substrate is put into a generally-used diffusion furnace and is appropriately thermally treated in a N$_2$ atmosphere for tens of minutes. Thus, the interlayer insulating film 14 is highly dense. The temperature for this heat treatment is appropriately chosen to be lower than the temperature at which the gate insulating film is formed, for example, in a range of 900° C. to 1,000° C.

Thereafter, the source window 63 is opened in the interlayer insulating film 14 resulting in insulating films 14a and 14b above the upper surface of the substrate as well as the gate oxide films 9a and 9b by using a generally-known photolithography process and a dry/wet etching process. Although not illustrated in the structure of FIG. 15B, the gate contact window formed at the periphery of the element region is also opened at the same time. In the case where an etchant solution or an etchant gas reaches the back surface of the substrate, a thermal oxide film (not shown) on the transitory polycrystalline Si film on the back surface is removed at the same time.

When the etching process is completed, a base material 25 for the source contact electrode is deposited on the entire upper surface of the substrate, above which the photoresists and the etching masks remain, by using a film formation process such as a DC sputtering process. For example, a Ni film, a Co film or the like, with a thickness of 50 nm, can be used as the base material 25 for the source contact electrode.

Figure 15B:
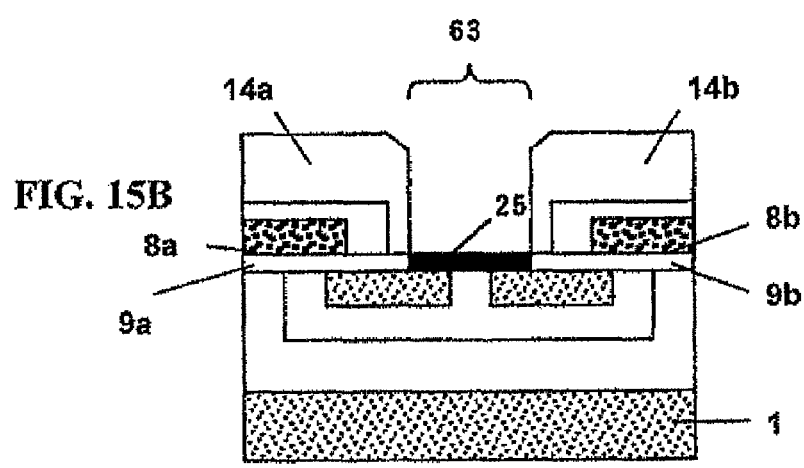

When the vapor deposition process is completed, the substrate is dipped in a specialized photoresist stripper. As such, the photoresist remaining on the surface of the substrate is completely removed. Thus, the substrate structure shown in FIG. 15B is obtained, wherein the base material 25 for the source contact electrode is deposited only on the source window 63 and in the bottom of the gate contact window.

Then, the substrate is fully cleaned and dried. Thereafter, the entire upper surface of the substrate is coated with a protective resist material such as photoresist with a thickness of 1 μm or more. Further, the polycrystalline Si film remaining on the back surface of the substrate is removed by using a dry etching process. The protective resist is needed to prevent the base material 25 for the contact electrode and the gate insulating films 14a and 14b from being deteriorated due to plasma-induced damage, electrostatic charge and contamination, which are caused during the dry etching process.

When the polycrystalline Si film on the back surface of the substrate 1 is removed, the substrate 1 is dipped into a buffered hydrofluoric acid solution. Thus, a transitory thermally-oxidized film (not shown), which has been formed on the back surface during the gate oxidation, is removed. Further, a clean crystal plane is exposed at the back surface of the epitaxial substrate 1. Then, the substrate is completely cleaned of the buffered hydrofluoric acid solution by using ultrapure water and is dried. Immediately after drying, the substrate is put into a vapor deposition system under a vacuum. Thus, a desired base material (not shown) for the drain contact electrode is deposited on the back surface of the substrate. For example, a Ni film or a Co film, with a thickness of 50 nm to 100 nm, can be used as the electrode base material on the back surface.

Figure 15C:
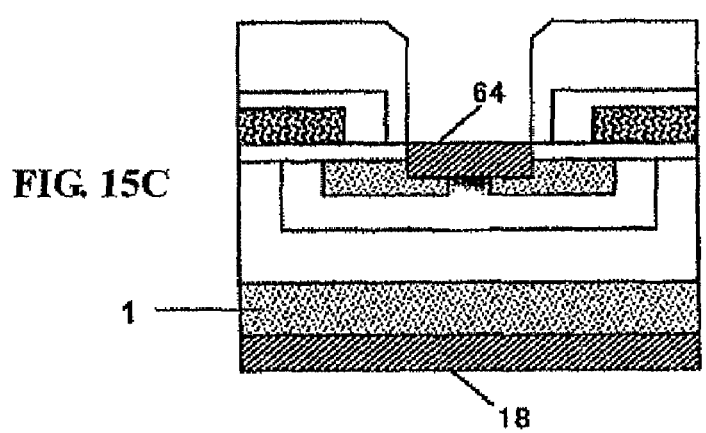

Next, the resist, which has been used to protect the surface of the substrate, is completely removed by using a specialized stripper solution. Then, the SiC epitaxial substrate 1 is fully cleaned, rinsed and dried. Immediately after drying, the substrate 1 is installed in a rapid heating process system. Thus, the rapid heating process (contact annealing process) is applied to the substrate 1 in a pure Ar atmosphere at a temperature of 1,000° C. for 2 minutes. Through this heat treatment, each of the base materials (Ni film) for the contact electrodes, which has been deposited in the bottom of the source window 63 and the bottom and the back surface of the gate contact window, is alloyed with the n$^+$ source regions 54a and 54b [/p$^+$ base contact region 57], the polycrystalline Si gate electrode contact region (not shown) and the back surface of the n+ SiC substrate. Accordingly, a source contact 64, which is ohmically contacted with an extremely low resistance, a gate contact (not shown) and a drain contact 18 are formed. As a result, a substrate structure shown in FIG. 15C is obtained.

Thereafter, the substrate, to which the contact annealing process has been applied, is installed into a magnetron sputtering system, which is kept in high vacuum. This is so that a desired material for interconnection, for example Al with a thickness of 3 μm, is deposited on the entire upper surface of the substrate.

Subsequently, photoresist is applied above the upper surface of the substrate, on which the Al film has been formed, and is then exposed to light and developed. Thus, a resist mask for an etching process is formed. Thereafter, the back surface of the substrate is coated with photoresist for protecting a back-surface electrode. After the resist is fully dried, the Al film is patterned by using a RIE process. Accordingly, the interconnection 16 connected to the source contact electrode 64 and an interconnection (not shown) connected to the gate electrode contact are formed.

Finally, the resist mask is completely removed by using a specialized stripper solution. Then, the substrate is fully cleaned and dried. As a result, the planar power MOSFET cell according to second embodiment (shown in FIG. 12) is completed.

The planar power MOSFET cell including the MOS structure according to the embodiments herein demonstrates very preferable transistor characteristics.

The components of the MOS structure demonstrate the same high reliabilities as the components of the MOS structure according to the first embodiment shown in FIGS. 8 and 9. That is, the planar power MOSFET cell and its manufacturing method improve the durability against TDDB of the gate oxide film in the SiC thermally-oxidized-filmed MOS gate structure included in a conventional planar power MOSFET. As such, the MCTB value is increased by at least one order of magnitude while simultaneously restraining the extension of the TDDB life distribution, thereby reducing the TDDB-induced defect rate.

The second embodiment is directed to applying the MOS structure of the embodiment to the planar power MOSFET cell. However, the embodiment can be applied to an insulated gate bipolar transistor (IGBT) cell including an element structure similar to the planar power MOSFET cell. Also, in such a case, the IGBT cell can have the same effects as the planar power MOSFET cell of the second embodiment.

The above-described embodiments have been described in order to allow easy understanding of the invention and do not limit the invention. On the contrary, the invention is intended to cover various modifications and equivalent arrangements included within the scope of the appended claims, which scope is to be accorded the broadest interpretation so as to encompass all such modifications and equivalent structure as is permitted under the law.

What is claimed is:

1. A method of manufacturing a silicon carbide (SiC) semiconductor device with a metal-oxide-semiconductor (MOS) structure including a SiC substrate, a gate oxide film formed on a surface of the SiC substrate and a gate electrode formed on the gate oxide film, the method comprising:
   increasing a temperature to at least a predetermined temperature while maintaining the SiC substrate in an inert gas atmosphere;
   when the temperature rises to at least the predetermined temperature, forming the gate oxide film by thermally-oxidizing the SiC substrate by introducing an oxidation gas; and
   when a thickness of the gate oxide film becomes a predetermined thickness, decreasing the temperature and stopping the thermal oxidation of the SiC substrate while stopping the introduction of the oxidation gas and reestablishing the inert gas atmosphere.

2. The method according to claim 1 wherein thermally-oxidizing the SiC substrate comprises:
   performing dry oxidation in a dry atmosphere with the oxidation gas being oxygen, nitrous oxide, nitric oxide, nitrogen dioxide, mixtures thereof, or a gas formed by diluting oxygen, nitrous oxide, nitric oxide, nitrogen dioxide or mixtures thereof with an inert gas.

3. The method of according to claim 2 wherein thermally-oxidizing the SiC substrate is performed at a temperature of 1,000° C. to 1,280° C.

4. The method according to claim 3, further comprising:
   initially forming an epitaxial layer on a principal surface of the SiC substrate, wherein the gate oxide film is formed by thermally oxidizing a surface layer of the epitaxial layer.

5. The method according to claim 1 wherein thermally-oxidizing the SiC substrate is performed at a temperature higher than any other temperature in subsequent processing steps.

6. The method according to claim 1 wherein the predetermined thickness is about 20 nm or less, 7. The method according to claim 1 wherein the predetermined thickness is about 15 nm or less.

8. The method according to claim 1 wherein the predetermined thickness is between about 8 nm to about 15 nm.

9. The method according to claim 1, further comprising:
   forming the gate electrode by depositing polycrystalline silicon on the gate oxide film.

10. The method according to claim 1 wherein thermally oxidizing the SiC substrate forms a lower insulating film, the method further comprising:
    forming a field insulating film by laying an upper insulating film on the lower insulating film, the upper insulating film formed by a process other than the thermal oxidation.

11. The method according to claim 10, further comprising:
    opening a gate window in a part of the field insulating film, exposing the gate oxide film,
    forming a gate electrode by depositing polycrystalline silicon on the gate oxide film and the field insulating film.

12. The method according to claim 11, further comprising:
    forming a polycrystalline silicon thermally-oxidized film by oxidizing a part of a surface of the gate electrode; and
    forming an interlayer insulating film on the gate oxide film and the polycrystalline silicon thermally-oxidized film, 13. The method according to claim 11, further comprising:
    forming a polycrystalline silicon thermally-oxidized film by oxidizing a part of a surface of the gate electrode; and
    forming an interlayer insulating film on the polycrystalline thermally-oxidized film and an exposed part of at least one of the gate oxide film and the field insulating film.

14. The method according to claim 1, further comprising:
    initially forming an epitaxial layer on a principal surface of the SiC substrate, wherein the gate oxide film is formed by thermally oxidizing a surface layer of the epitaxial layer.

* * * * *